United States Patent [19]
Kimura et al.

[11] Patent Number: 5,976,954
[45] Date of Patent: Nov. 2, 1999

[54] METHOD AND APPARATUS FOR CLEANING AND SEPARATING WAFERS BONDED TO A FIXING MEMBER

[75] Inventors: Shigeru Kimura, Hyogo-ken; Shigeo Kumabe, Tokyo, both of Japan

[73] Assignees: Mitsubishi Materials Corporation; Mitsubishi Materials Silicon Corporation, both of Tokyo, Japan

[21] Appl. No.: 08/869,145

[22] Filed: Jun. 4, 1997

[30] Foreign Application Priority Data

| Jun. 4, 1996 | [JP] | Japan | 8-142000 |
| Jun. 4, 1996 | [JP] | Japan | 8-142001 |

[51] Int. Cl.$^6$ ..................................... H01L 21/68
[52] U.S. Cl. ........................... 438/464; 438/973; 438/974
[58] Field of Search ............................... 134/18; 438/464, 438/973, 974

[56] References Cited

U.S. PATENT DOCUMENTS

| 3,478,418 | 11/1969 | Pomante | 438/464 |
| 4,664,739 | 5/1987 | Aurichio | 438/464 |
| 4,897,141 | 1/1990 | Girard | 438/464 |
| 4,904,610 | 2/1990 | Shyr | 438/464 |
| 5,071,792 | 12/1991 | Van Vonno et al. | 438/464 |
| 5,362,681 | 11/1994 | Roberts, Jr. et al. | 438/464 |
| 5,667,423 | 9/1997 | Itoi | 451/5 |

*Primary Examiner*—Jill Warden
*Assistant Examiner*—Saeed Chaudhry
*Attorney, Agent, or Firm*—Oblon, Spivak, McClelland, Maier & Neustadt, P.C.

[57] ABSTRACT

The present invention relates to a method of cleaning wafers bonded on a fixing member in the form of an ingot, and then sliced by a wire saw from a direction perpendicular to the longitudinal dimension to form a row of wafers. The method includes: a cleaning process for cleaning the wafers bonded on the fixing member in the form of the row of wafers (workpiece W) by a cleaning mechanism; and a separating process includes: a softening step for softening an adhesive in a softening vessel; a first moving step for turning and moving a wafer in a planar direction using an end point of the glued portion of the wafer and the fixing member as the fulcrum; and a second moving step for further moving the wafer in a planar direction by a suction-cup rotary actuator to thereby bring the wafer out of the region of the row of wafers.

3 Claims, 10 Drawing Sheets

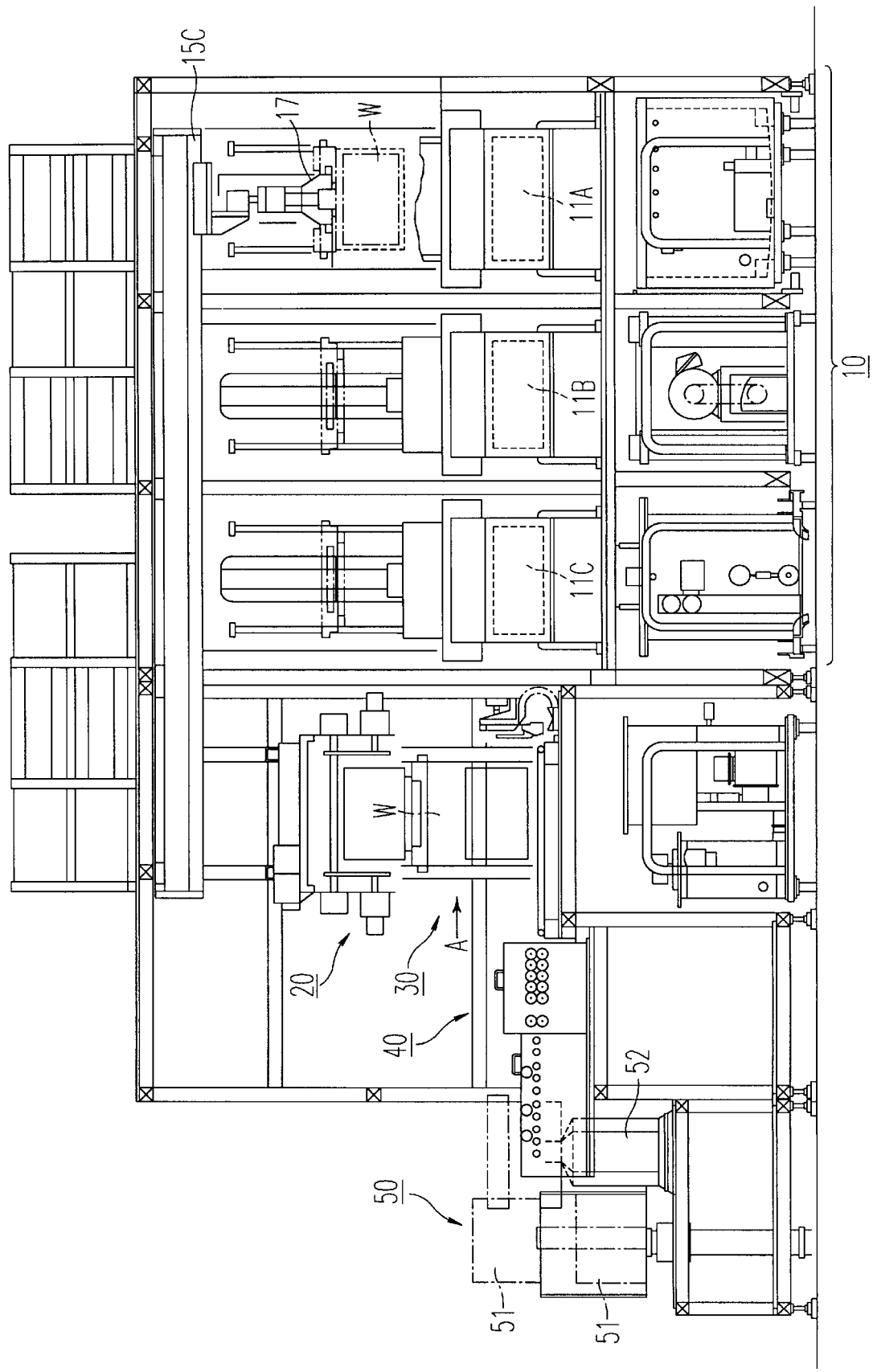

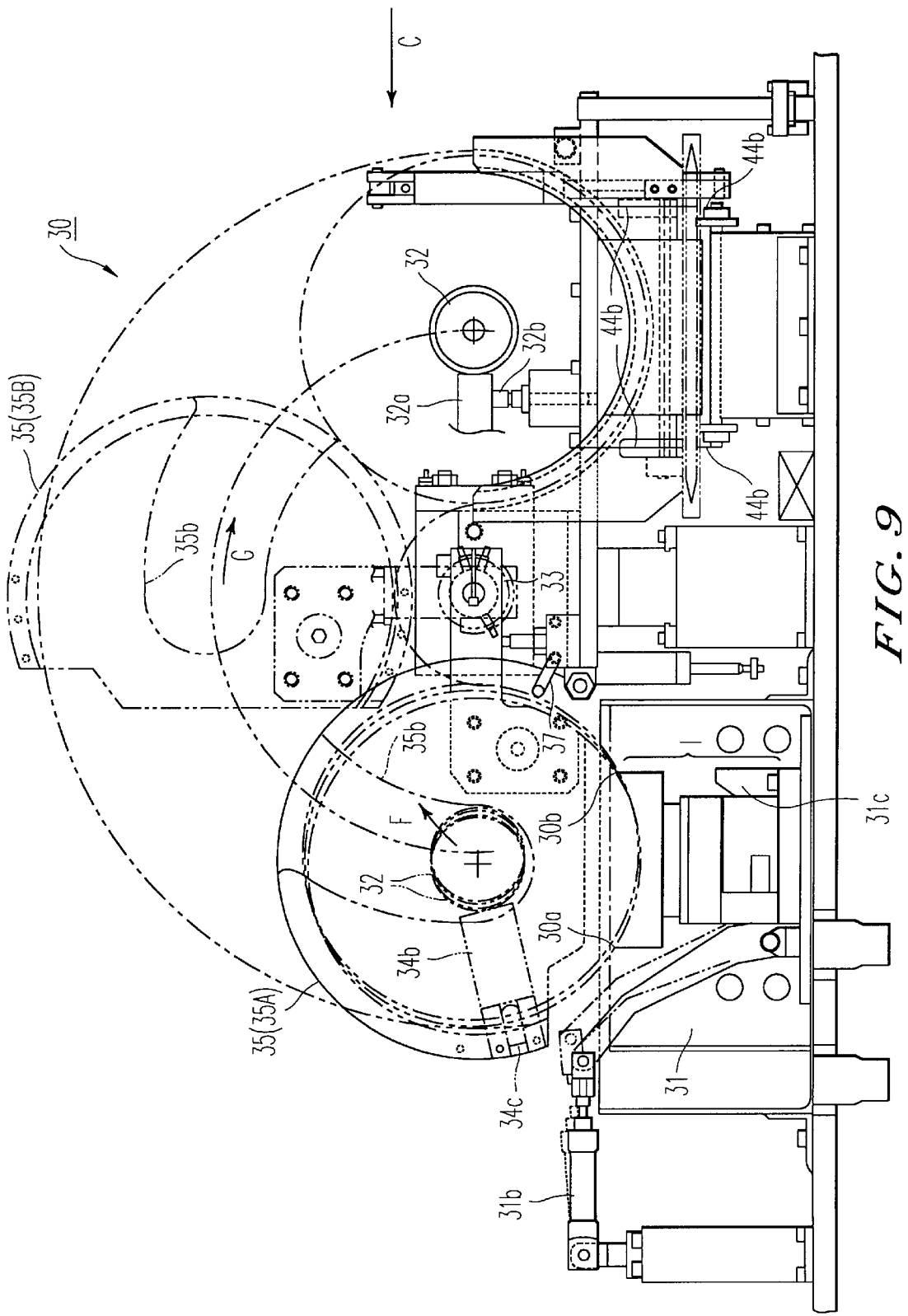

METHOD AND APPARATUS FOR CLEANING AND SEPARATING WAFERS BONDED TO A FIXING MEMBER

BACKGROUND OF THE INVENTION

1. Field of the Invention

The present invention relates to a method of and an apparatus for cleaning and separating wafers which are bonded on a fixing member in the form of an ingot by means of an adhesive, and then sliced by a wire saw in a direction perpendicular to a longitudinal dimension to form a row of wafers.

2. Discussion of the Related Art

As is generally known, in preparing wafers of a semiconductor material, a magnetic material and ceramics, etc., these materials are bonded on a fixing member in the form of an ingot, and then sliced utilizing a wire saw from a direction perpendicular to the longitudinal dimension to form a row of wafers.

Usually, the slicing by the wire saw is performed while spraying a slurry-like grinding liquid, and, after the material has been completely sliced, further performed to such a depth to reach a part of the fixing member. For this reason, the row of wafers after the slicing are bonded on the fixing member through the adhesive and smeared with the grinding liquid, and the grinding liquid enters among the adjacent wafers.

To obtain each wafer from this row of wafers, a plurality of wafers are manually separated from the fixing member, and then these plurality of wafers are manually separated one at a time. Thereafter, each wafer is cleaned to remove the grinding liquid.

The above-described separating operation, however, includes a process in which an operator flexibly separates a suitable number of wafers in accordance with the bonding condition of the wafers, and makes automation difficult.

That is, generally speaking, wafers are highly fragile, and since such wafers are glued together, it has been a technical problem as to how to separate them from each other by using a small force without causing any strain to the wafers.

The manual operation is advantageous in that it allows subtle adjustment in applying forces in accordance with the gluing condition, and it is difficult to replace this by a mechanical operation. Further, the requisite cost would be rather high.

In addition, in the above-described method, the row of wafers smeared with the grinding liquid must be handled in separating a plurality of wafers from the row of wafers. The wafers smeared with the grinding liquid is difficult to be mechanically handled, and make automation further difficult. Moreover, the grinding liquid contaminates devices.

Therefore, there is a demand for the development of a method which is suited for automation of the above process. In order to facilitate automation and keep the devices as clean as possible, a removal of the grinding liquid at an early stage has been requested.

SUMMARY OF THE INVENTION

The present invention is made in view of the above-described circumstances, and an object of the invention is to provide a method of and an apparatus for cleaning wafers which can accomplish automation and remove the grinding liquid at an early stage.

In the method of separating wafers of the present invention, there is provided a method of separating wafers from a row of wafers glued to a fixing member by an adhesive, the method comprising: a softening step for softening the adhesive; a first moving step for turning and moving a wafer in a planar direction using an end point of the glued portion between the wafer and the fixing member as a fulcrum; and a second moving step for moving the wafer further in a planar direction to bring it out of the region of the row of wafers.

In the method of separating wafers according to a further feature of the invention, there is provided a method of separating wafers wherein, to reduce the surface tension between the wafer and a wafer adjacent thereto, there is provided a step for jetting a gas flow toward the gap between these wafers.

In the apparatus for separating wafers according to the present invention, there is provided an apparatus for separating wafers from a row of wafers glued to a fixing member by an adhesive, the apparatus comprising: a softening vessel for immersion of the glued portion to thereby soften the adhesive; a wafer suction cup for sucking the surface of a wafer at an end of the row of wafers; first moving means for causing the wafer suction cup and the fixing member to make a relative sliding movement in a planar direction of the wafer and turning and moving the wafer in a planar direction using an end point of the section where the wafer is glued to the fixing member as a fulcrum; and second moving means for moving the wafer suction cup to move the wafer in a planar direction to thereby bring it out of the region of the row of wafers.

In the apparatus for separating wafers according to the present invention, there is provided an apparatus for separating wafers wherein, in the vicinity of the wafer to be separated, there is provided a nozzle for jetting a gas flow toward the gap between the wafer to be separated and a wafer adjacent thereto.

In the apparatus for separating wafers according to a feature of the present invention, there is provided an apparatus for separating wafers further comprising: a presser member which covers the portion of the row of wafers that is in the vicinity of the end thereof and which has a slit that allows passing through of a wafer situated at the end and a cutout that allows movement of the wafer suction cup sucking the wafer; and presser member driving means for causing the presser member to move between a pressing position in the vicinity of the end of the row of wafers and a retracted position that is spaced apart from the pressing position.

In the apparatus for separating wafers according to a further feature of the present invention, there is provided an apparatus for separating wafers which further comprises: a reversing mechanism for rotating the fixing member and the row of wafers around the axis of the row of wafers prior to the immersion of the row of wafers in the softening vessel, the reversing mechanism comprising: a support member having a rack arranged to be perpendicular to the longitudinal dimension of the row of wafers, a pinion adapted to rotate in engagement with the rack, and an engagement arm which swings with the rotation of the pinion and which engages with the fixing member with the axis of the pinion and the axis of the row of wafers being in alignment with each other; and rotating means for rotating the support member.

In an aspect of the method of the invention as discussed above, the adhesive is softened in the softening step, and then the wafer is turned and moved using an end point of the glued portion as the fulcrum in the first moving step. In this case, in the glued portion, the adhesive is gradually and continuously separated, starting from the other end point of the glued portion, so that the major portion of the adhesive is separated with a small force. Then, in the second moving step, the wafer is further moved in a planar direction to bring it out of the region of the row of wafers. At this stage, the major portion of the adhesive has already been removed, so that only a small force is required for the separation.

In a further aspect of the method of the invention, a gas flow is jetted toward the gap between the wafers, whereby the surface tension between the wafers is reduced, and the requisite force for separation is further reduced.

In a further aspect of the apparatus of the invention, the glued portion is immersed in the softening vessel, whereby the adhesive is softened. Then, by utilizing the first moving means, the wafer suction cup and the fixing member are caused to slide relative to each other, whereby the wafer is turned in a planar direction using an end point of the glued portion of the wafer and the fixing member as the fulcrum. Further, by utilizing the second moving means, the wafer is moved out of the region of the row of wafers.

In a further aspect of the apparatus of the invention, in the vicinity of the wafer to be separated, there is provided a nozzle for jetting a gas flow toward the gap between the wafer to be separated and a wafer adjacent thereto, so that the surface tension between the wafers is reduced.

In a further aspect of the invention, when the wafer is moved by the second moving means, the presser member is arranged at the pressing position that is in the vicinity of the end of the row of wafers. Then, the slit allows passing through of only one wafer to thereby prevent adjacent wafers from moving together.

In a further aspect of the invention, there is provided a reversing mechanism, whereby the transition from the foregoing step is smoothed.

In a further feature of the method of cleaning wafers of the present invention, there is provided a method of cleaning wafers bonded on a fixing member in the form of an ingot, and then sliced by a wire saw from a direction perpendicular to the longitudinal dimension to form a row of wafers, the method comprising: a cleaning process for cleaning wafers bonded on the fixing member in the form of the row of wafers; and a separating process for separating the wafers one at a time from the end of the row of wafers cleaned in the form of the row of wafers.

In a further feature of the method of cleaning wafers of the present invention, there is provided a method of cleaning wafers which further comprises a wafer cleaning process for cleaning sequentially the wafers separated one at a time.

In the method of cleaning wafers of the present invention, there is also provided accommodating process for accommodating the wafers in a accommodating container.

In a further feature of the method of cleaning wafers of the present invention, there is also provided a method of cleaning wafers, wherein the cleaning process includes a plurality of cleaning processes.

In a further aspect of the apparatus for cleaning wafers of the present invention, there is provided an apparatus for cleaning wafers bonded on a fixing member in the form of an ingot, and then sliced by a wire saw from a direction perpendicular to the longitudinal dimension to form a row of wafers, the apparatus comprising: a cleaning mechanism having a wafer cleaning vessel, a vibrating means for providing vibrations to the wafer cleaning vessel and a row-of-wafer conveying means for conveying the row of wafers to the wafer cleaning vessel, in order to clean the wafers bonded on the fixing member in the form of the row of wafers; and a separating mechanism having a wafer suction cup for sucking a wafer located at the end of the row of wafers, and a driving means for moving the wafer suction cup, in order to separate the wafers one at a time from the end of the row of wafers cleaned in the form of the row of wafers.

In a further aspect of the apparatus for cleaning wafers of the present invention, there is provided an apparatus for cleaning wafers which further comprises a wafer cleaning mechanism having brushes for cleaning, and spray means for spraying cleaning liquid toward cleaning sections by the brushes, in order to clean sequentially the wafers separated one at a time.

In a further feature of the apparatus for cleaning wafers of the present invention, there is provided an apparatus for cleaning wafers which further comprises an accommodating mechanism having a wafer conveying means, in order to accommodate the wafers in an accommodating container.

In a further aspect of the apparatus for cleaning wafers of the present invention, there is provided an apparatus for cleaning wafers wherein the cleaning mechanism is provided with a plurality of wafer cleaning vessels.

According to a further aspect of the invention, the cleaning is performed in the form of a row of wafers bonded on the fixing member, so that the grinding liquid is removed at an early stage, and handling by an automatic means can be easily carried out. In addition, the wafers are separated one at a time from the end of the row of wafers cleaned in the form of the row of wafers, so that automation is facilitated.

According to a further aspect of the invention, each wafer which has been cleaned one at a time is sequentially cleaned, whereby contaminants remaining on the wafers can be removed.

According to a further aspect of the invention, each wafer is accommodated in the accommodating container, so that its handling is easy, and transition to the next step is smoothly effected.

According to a further aspect of the invention, the cleaning process includes a plurality of cleaning processes, whereby a more perfect cleaning effect is be expected.

According to a further aspect of the invention, the row of wafers is conveyed in the wafer cleaning vessel by the row-of-wafer conveying means, and cleaned in the wafer cleaning vessel. Then, a wafer located at the end of the cleaned row of wafers is sucked by the wafer suction cup. The wafer is moved by the driving means together with the wafer suction cup with the wafer being sucked by the wafer suction cup, and then separated from the row of wafers.

According to a further aspect of the invention, each wafer is cleaned by the brushes with the cleaning liquid sprayed by the spray means.

According to a further aspect of the invention, each wafer is accommodated in the accommodating container by the wafer conveying means.

According to a further aspect of the invention, the cleaning mechanism is provided with a plurality of wafer cleaning vessels, so that a plurality of cleaning processes can be provided, whereby a more perfect cleaning effect is expected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein:

FIG. 1 is a front view showing one embodiment of a wafer cleaning apparatus of the present invention;

FIG. 9 is a left-hand side view, viewed from the direction of the arrow A in FIG. 1, of a separating mechanism in the wafer cleaning apparatus shown in FIG. 1;

DESCRIPTION OF THE PREFERRED EMBODIMENTS

Figure 3:
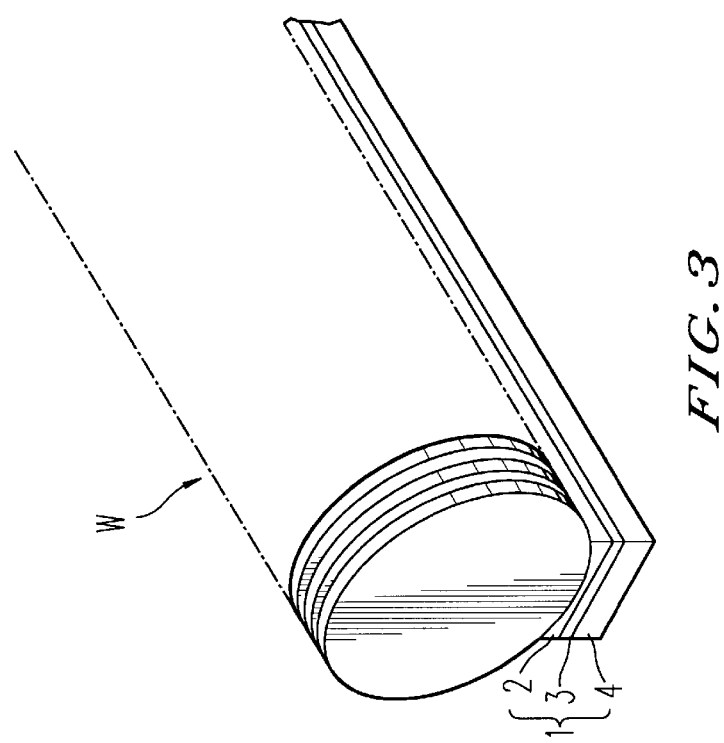
FIG. 3 is a perspective view showing a workpiece to be handled by the wafer cleaning apparatus as shown in FIG. 1 is applied.

Referring now to the drawings, wherein like reference numerals designate identical or corresponding parts throughout to several views, an embodiment of the method of and apparatus for cleaning wafers of the present invention will now be described.

Figure 2:
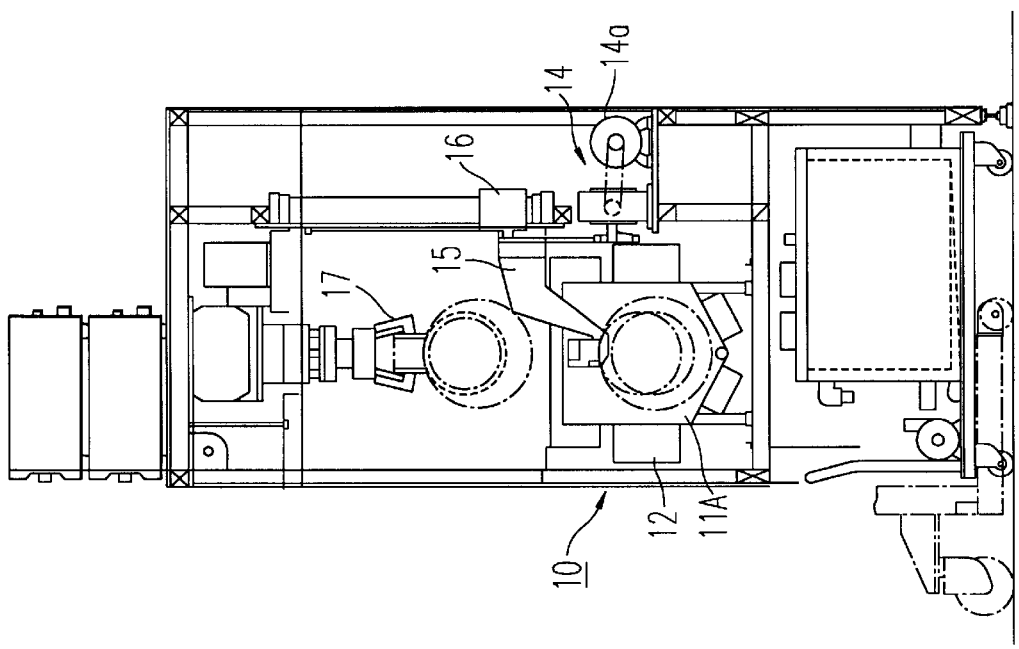
FIG. 2 is a side view of the wafer cleaning apparatus shown in FIG. 1.

FIGS. 1 and 2 show an embodiment of a wafer cleaning apparatus of the present invention. The wafer cleaning apparatus of the present invention comprises a cleaning mechanism 10, a reversing mechanism 20, a separating mechanism 30, a wafer cleaning mechanism 40 and an accommodating mechanism 50.

Workpiece W, which is the object to be handled in this embodiment, is, as shown in FIG. 3, a row of wafers on a fixing member 1. In this case, the fixing member 1 is composed of carbon 2, glass 3 and an iron base 4, and the wafers are obtained from an ingot, which is bonded on the fixing member 1, and then sliced into a row of wafers from a direction perpendicular to the longitudinal dimension by a wire saw. Here, the slicing is performed to the depth of the carbon 2, and the wafers are completely separated from each other and individually bonded on the fixing member 1 so as to be arranged side by side. In this embodiment, the wafer is an 8-inch silicon wafer, and 200 to 250 wafers are arranged to constitute the workpiece W to be handled.

[Cleaning mechanism]

Figure 5:
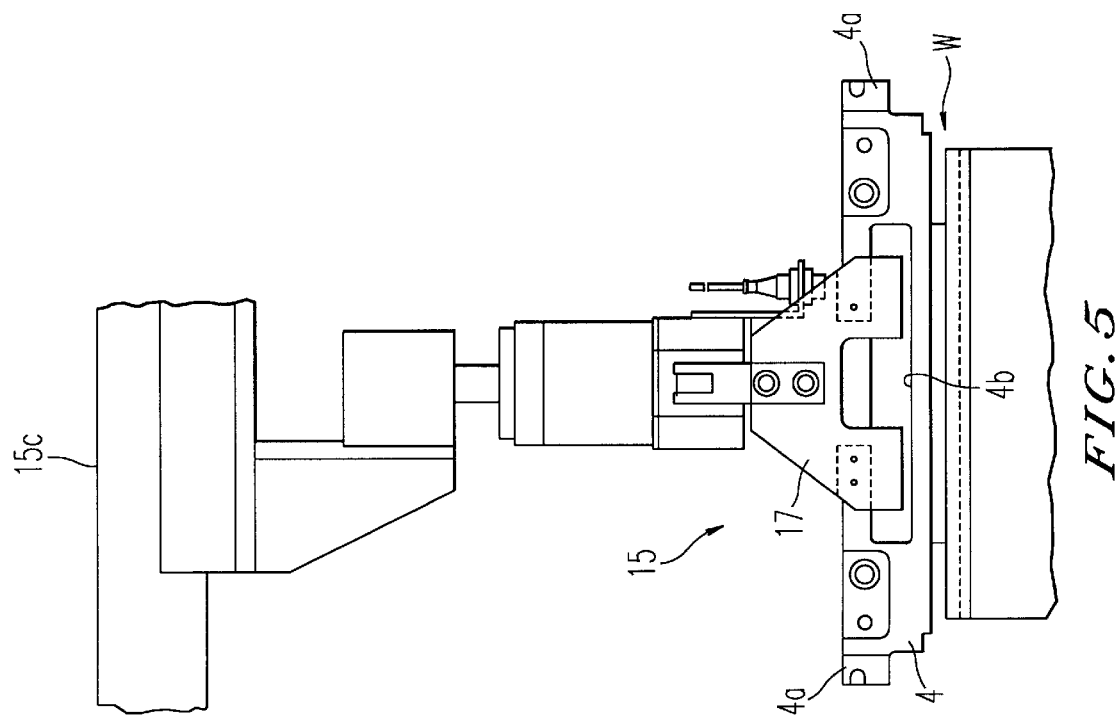
FIG. 5 is a front view showing a row-of-wafer conveying means in the cleaning mechanism shown in FIG. 4.
Figure 6:
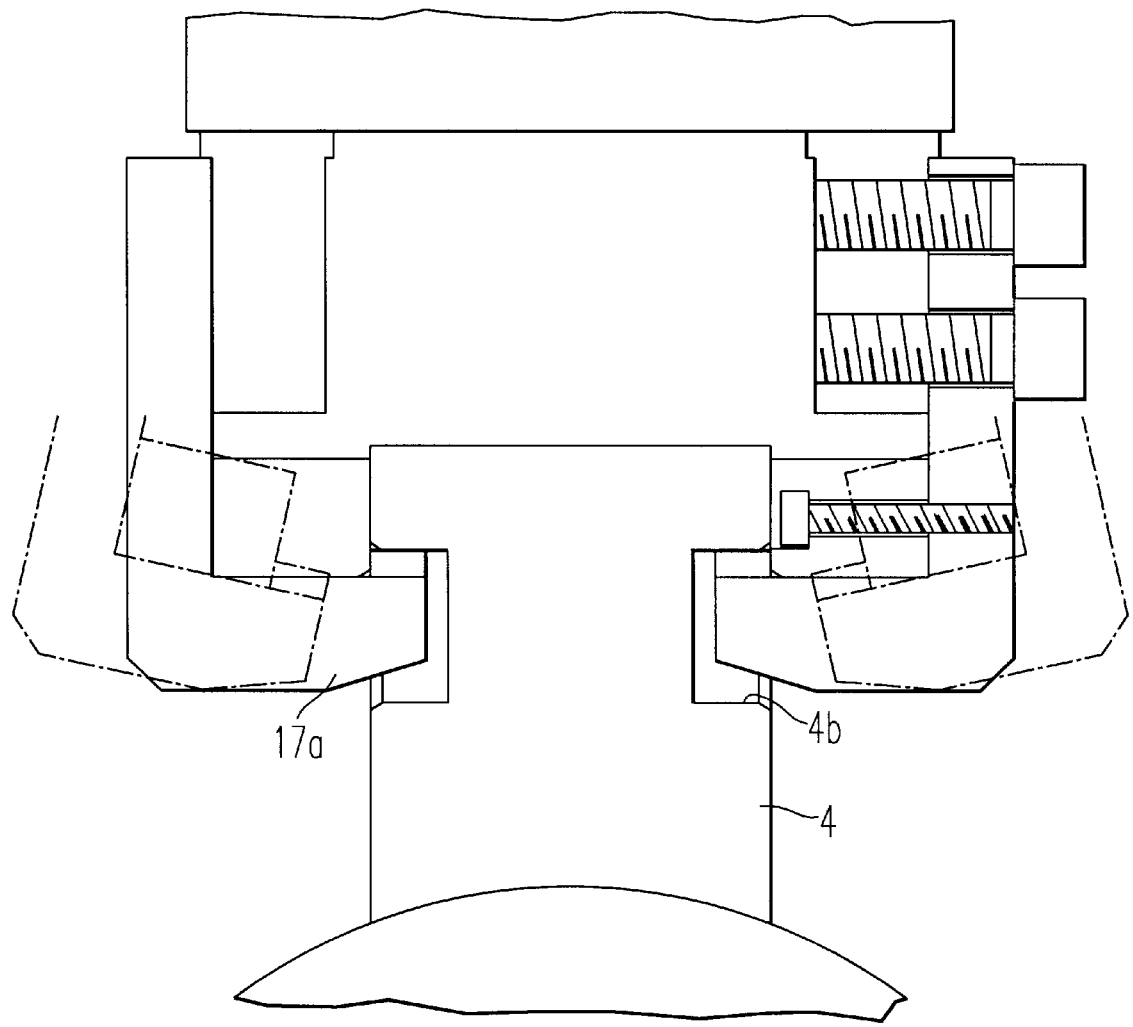
FIG. 6 is an enlarged side view showing a part of the row-of-wafer conveying means shown in FIG. 5.

The cleaning mechanism is intended for cleaning the row of wafers, which is bonded on the fixing member 1, in this form. The cleaning mechanism 10 includes, as shown in FIGS. 4 to 6, wafer cleaning vessels 11A, 11B and 11C, ultrasonic vibrators 12 (vibrating means), a row-of-wafers conveying means 13, and a shaking means 14.

Figure 4:
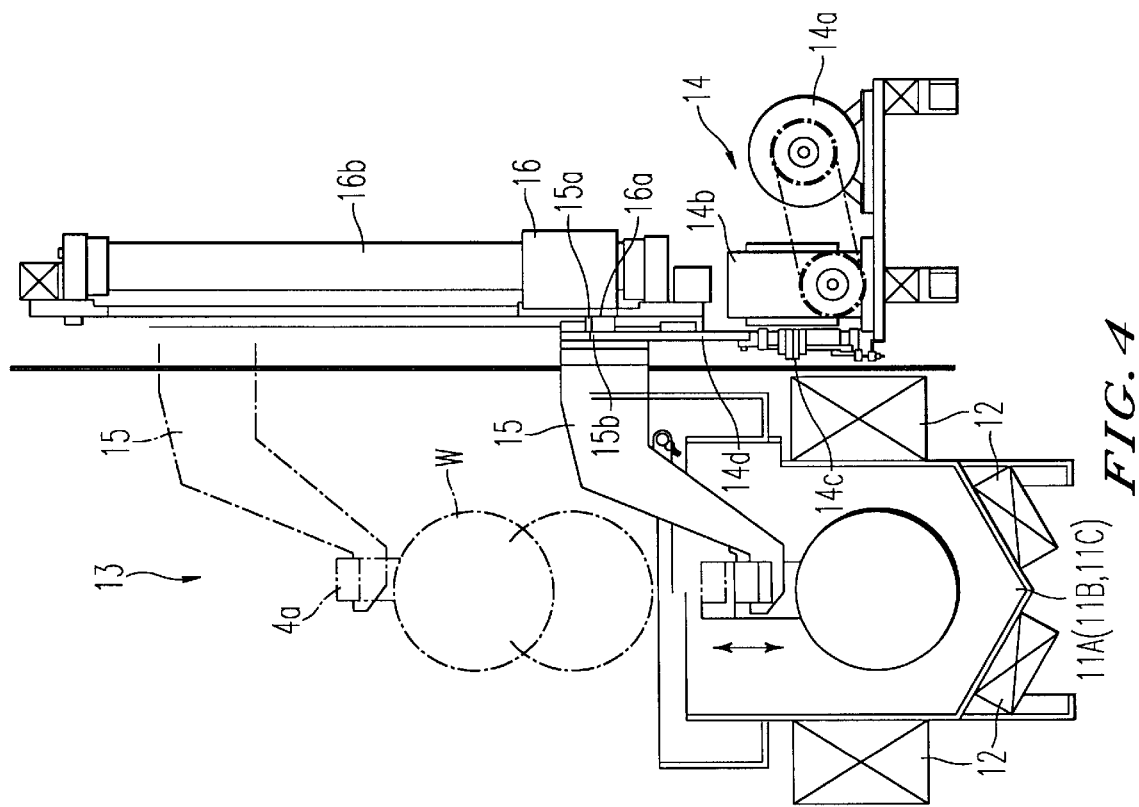
FIG. 4 is a side view showing a cleaning mechanism in the wafer cleaning apparatus shown in FIG. 1.

The ultrasonic vibrators 12 are, as shown in FIG. 4, mounted on the side and bottom walls of the wafer cleaning vessels 11A, 11B and 11C, and function so as to provide vibrations to the cleaning liquid in the wafer cleaning vessels 11A, 11B and 11C and to the workpiece W.

The conveyance of the row of wafers is effected with respect to the vertical directions and the direction in which it advances.

First, with reference to FIG. 4, the conveyance of the wafers in the vertical directions by the row-of-wafers conveying means 13 will now be described.

The conveyance in the vertical directions is effected for the purpose of immersing the workpiece W in the wafer cleaning vessels 11A, 11B and 11C and for the purpose of raising the workpiece W from the wafer cleaning vessels 11A, 11B and 11C. Two support arms 15 for holding the workpiece W support engagement portions 4a formed at both longitudinal ends of the base 4 from below, and a guide member 16, which supports first engagement portions 15a of these supporting arms 15 on a step portion 16a, is moved along a guide rail 16b, whereby the conveyance in the vertical directions is effected.

Next, with reference to FIGS. 5 and 6, the conveyance in the wafer advancing direction by the row-of-wafers conveying means 13 will be described.

A holding arm 17 for holding the workpiece W holds the workpiece W by inserting from either side an engagement claw 17a into each of grooves 4b formed on either side of the base 4, and conveys the workpiece W between the wafer cleaning vessels 11A, 11B and 11C along a rail 15c. In this way, the conveyance in the advancing direction is effected.

The shaking means 14 is intended for shaking the workpiece W in the wafer cleaning vessels 11A, 11B and 11C, and is composed of a motor 14a, a reduction gear 14b, a crank member 14c, a support rod 14d and second engagement portions 15b of the supporting arms 15.

The shaking motion is obtained by effecting speed reduction on the rotation output of the motor 14a by the reduction gear 14b and then converting the rotating movement into a vertical shaking movement by the crank member 14c, and this shaking motion is transmitted to the workpiece W through the support rod 14d engaged with the second engagement portions 15b.

In this case, the engagement of the first engagement portion 15a with the step portion 16a can be canceled by lowering the guide member 16 from the position at which the second engagement portions 15b are supported by the support rod 14d. Thus, the conveyance in the vertical directions and the shaking movement can be selectively effected.

[Reversing mechanism 20]

Figure 8:
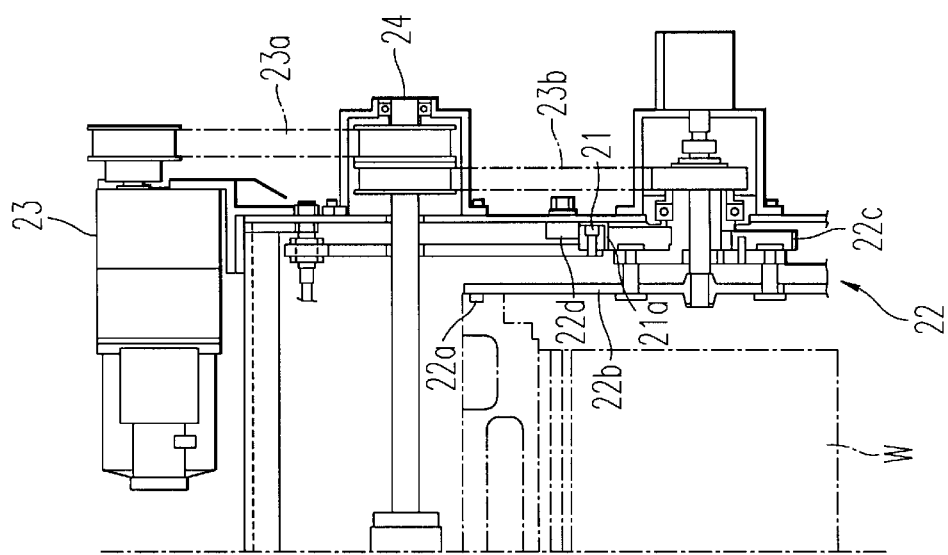
FIG. 8 is a front view, viewed from the direction of the arrow B in FIG. 7, of the reversing mechanism shown in FIG. 7.

The reversing mechanism 20 is intended for turning the fixing member 1 and the row of wafers by 180° around the axis of the row of wafers, i.e., for reversing it upside down. The reversing mechanism 20 comprises, as shown in FIGS. 7 and 8, two support rods 21, two support members 22 and a driving motor 23 for rotating these support members 22.

Figure 7:
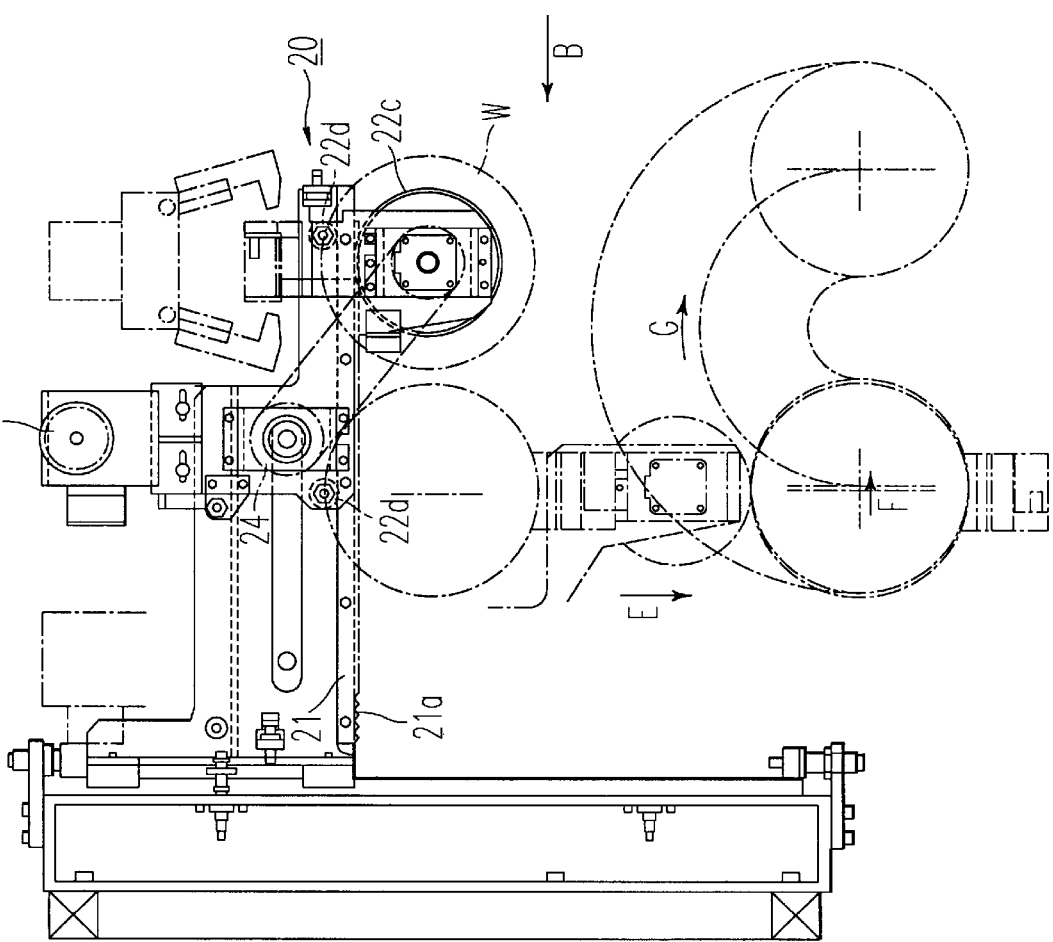
FIG. 7 is a left-hand side view, viewed from the direction of the arrow A in FIG. 1, of a reversing mechanism in the wafer cleaning apparatus shown in FIG. 1.

In this case, it should be noted that FIG. 7 is a view of the turning mechanism 20 viewed from the direction of the arrow A of FIG. 1. In addition, FIG. 8 is a view of the turning mechanism 20 viewed from the direction of the arrow B in FIG. 7.

The support rods 21 are perpendicular to the longitudinal dimension of the row of wafers, and arranged in parallel at the longitudinal both ends of the row of wafers. A rack 21a is formed on the lower surface of each support rod 21.

Each support member 22 has an engagement arm 22b which holds laterally the fixing member 1 on either side thereof by engaging a claw 22a with a hole of the fixing member 1, and a pinion 22c which rotates in engagement with the rack 21a at a position spaced apart from this engaging arm 22b.

When the pinion 22c rotates in engagement with the rack 21a, the engagement arm 22b swings therewith. In addition, the engagement arm 22b is disposed such that the claw 22a is engaged with the hole of the fixing member 1 with the axis of the pinion 22c being in alignment with the axis of the row of wafers.

The driving motor 23 can rotate the support member 22 through a belt 23a stretching between the driving motor 23 and an intermediate member 24, and a belt 23b stretching between the intermediate member 24 and the support member 22. In this case, due to the engagement of the rack 21a with the pinion 22c, the engagement arm 22b and the workpiece W are turned by 180° around the axis of the row of wafers. In this case, with the reversal, the driving motor 23, intermediate member 24 and support member 22 move in parallel as a whole due to the turning of the support rollers 22d, 22d on the support rods 21.

[Separating mechanism 30]

Figure 10:
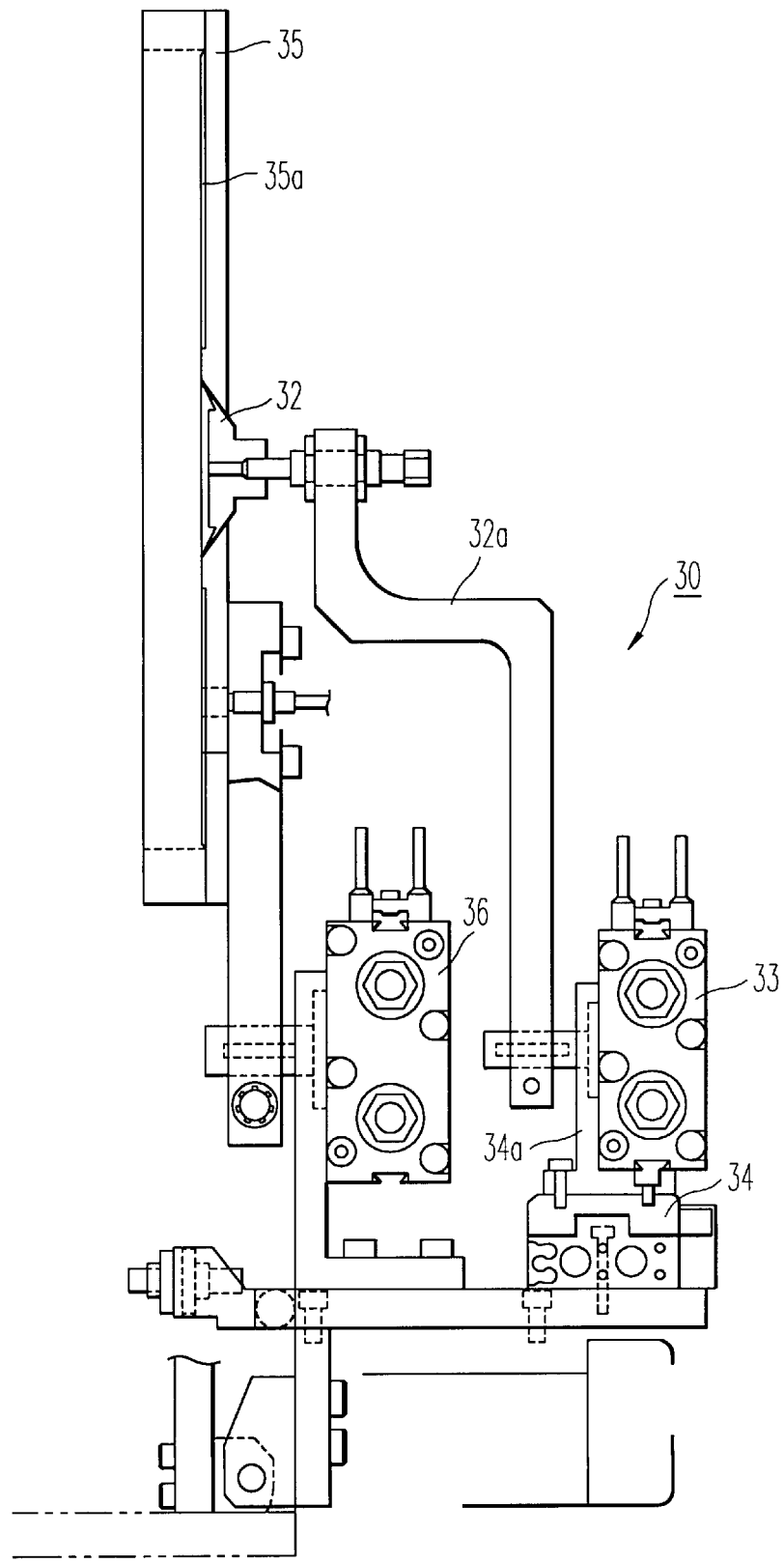
FIG. 10 is a front view, viewed from the direction of the arrow C in FIG. 9, of the separating mechanism shown in FIG. 9.
Figure 11:
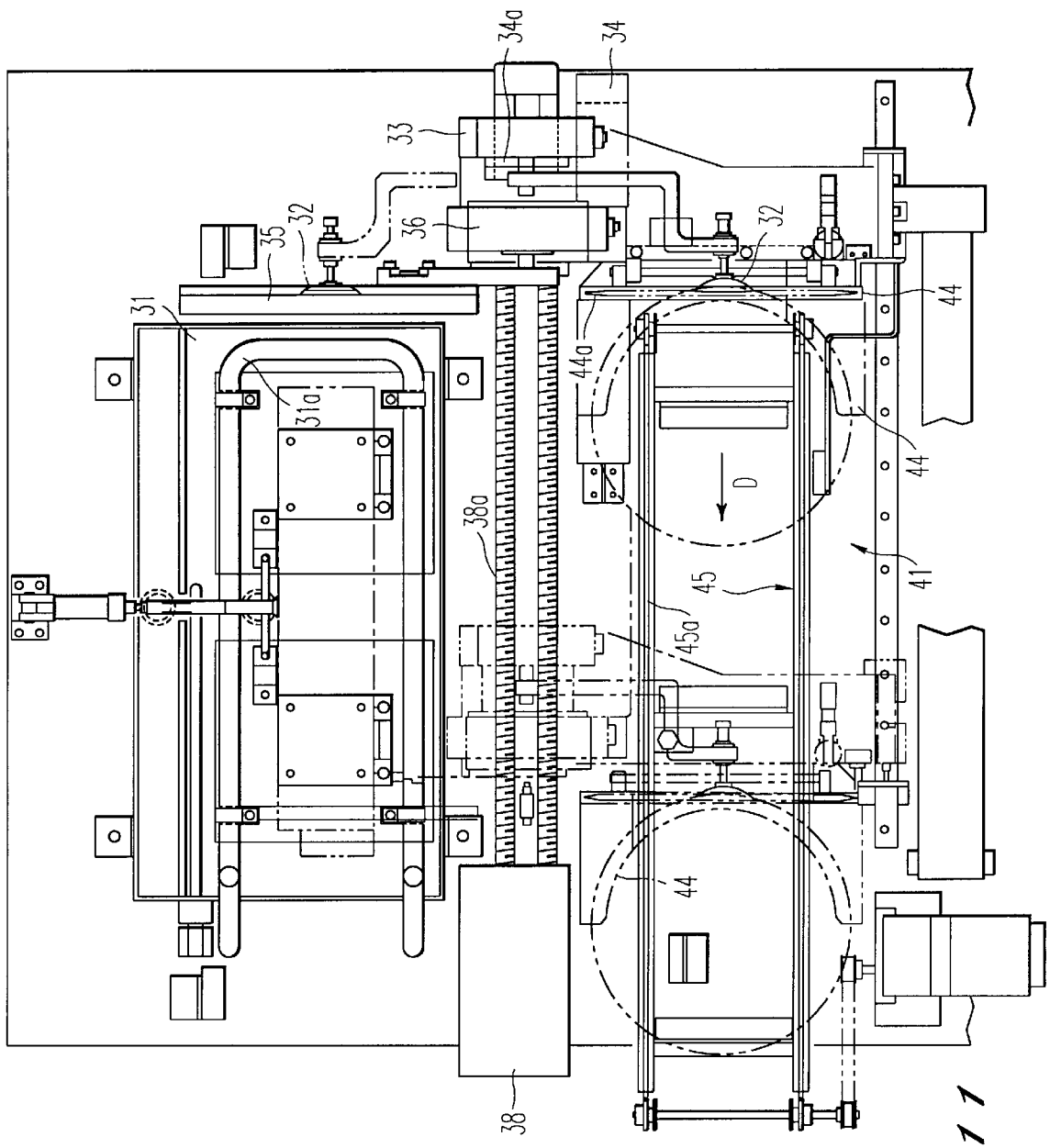
FIG. 11 is a plan view showing the separating mechanism in the wafer cleaning apparatus shown in FIG. 1.

The separating mechanism 30 is intended for separating the wafers one at a time from the end of the row of wafers cleaned in this form. The separating mechanism 30, as shown in FIGS. 9 to 11, includes a softening vessel 31, a wafer suction cup 32, a swinging arm 32a, a suction-cup rotary actuator (driving means) 33, an air slide table 34, a presser member 35, a presser-member rotary actuator 36, an air nozzle 37, ball screws 38a, and a slide motor 38.

In this case, it should be noted that FIG. 9 is a view of the separating mechanism 30, viewed from the direction of the arrow A in FIG. 1. It should be also noted that FIG. 10 is a view of the separating mechanism 30, viewed from the direction of the arrow B in FIG. 9 showing the wafer suction cup 32 and the presser member 35 at their top position.

The softening vessel 31 is intended for softening the adhesive through which the wafers are bonded to the fixing member 1, and is a vessel provided with a heater 31a. In the softening vessel 31, a fixing cylinder 31b and fixing frame 31c are provided for the purpose of fixing the fixing member 1 of the workpiece W.

In this embodiment, a water vessel of about 90° C. is used based on the fact that the adhesive is an epoxy adhesive. The present invention is not restricted thereto, and the temperature, solvent, etc. may be suitably selected in accordance with the adhesive employed.

The wafer suction cup 32 is connected to an unillustrated vacuum suction source and is intended for sucking a wafer located at an end of the row of wafers. The wafer suction cup 32 is rotated by the suction-cup rotary actuator 33 through the swinging arm 32a supporting this wafer suction cup 32, whereby the wafer sucked by the wafer suction cup 32 is moved in a planar direction, and extensively turned so as to be brought out of the region of the row of wafers. In this case, on the reception side for the separated wafer, there is provided a shock absorber 32b for flexibly receiving the engagement arm 32a.

The air slide table 34 is intended for turning and moving the wafer in a planar direction employing an end point of the bonded section of the wafer and the fixing member 1 as a fulcrum. By transversely sliding the shaft of the suction-cup rotary actuator 33 through a connecting member 34a, the wafer suction cup 32, the swinging arm 32a and the suction-cup rotary actuator 33 can be moved transversely as a single unit.

In this case, instead of the air slide table 34, or in addition to the air slide table 34, it is also possible to employ a combination of a cylinder 34b and a hook 34c attached to the presser member 3S described later.

The hook 34c functions as an engagement claw, and is driven by the cylinder 34b to engage only one wafer located at the end of the row of wafers through a slit 35a described below, making it possible to shift this wafer alone transversely.

The presser member 35 is intended for covering the portion near the end of the row of wafers to allow only one wafer located at the end of the row of wafers and prevent the adjacent wafer from moving. For this purpose, the presser member 35 has a slit 35a which is a gap that allows passing through of only one wafer when the portion of the row of wafers near its end is covered. In addition, the presser member 35 has a cutout 35b which allows the movement or passage of the wafer suction cup 32.

The presser member 35 is connected to the presser-member rotary actuator 36 and turned between the pressing position 35A and the retracted position 35B.

The air nozzle 37 is provided in the vicinity of the wafer to be separated, and, in order to reduce the surface tension acting between the wafer to be separated and the wafer adjacent thereto, it jets an air flow toward the gap formed between these wafers.

Each time wafer separation is completed, the slide motor 38 collectively moves the wafer suction cup 32, the swinging arm 32a, the suction cup rotary actuator 33, the air slide table 34, the presser member 35, the presser-member rotary actuator 36, the air nozzle 37 and a receiving member 44 described below by a predetermined length along the ball screws 38a in the direction indicated by the arrow D in FIG. 11.

[Wafer cleaning mechanism 40]

Figure 12:
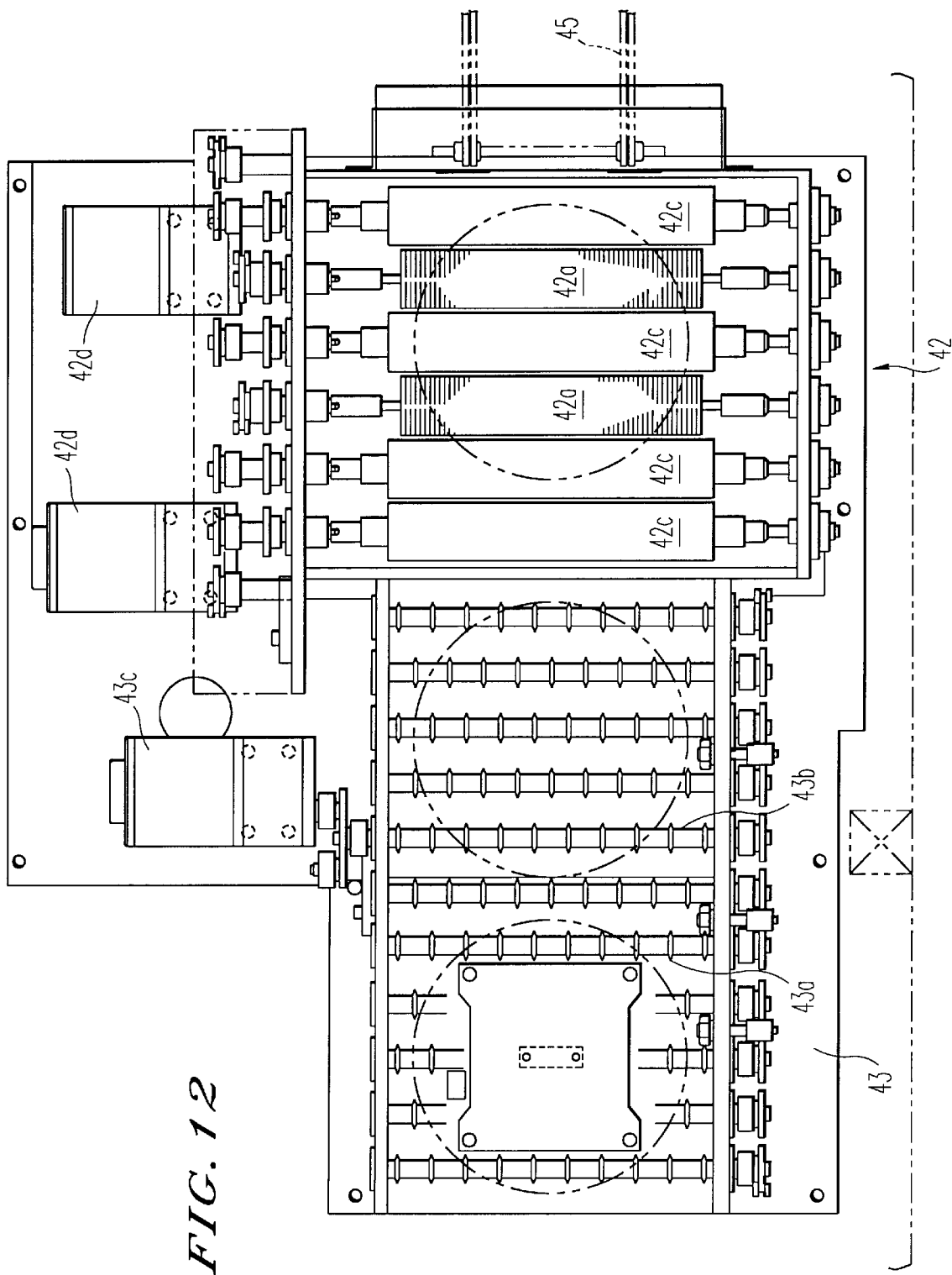
FIG. 12 is a plan view showing a wafer cleaning mechanism in the wafer cleaning apparatus shown in FIG. 1.

The wafer cleaning mechanism 40 is intended for cleaning the separated wafers one at a time, and comprises, as shown in FIGS. 11 and 12, a passing means 41, a wafer cleaning means 42 and a drying means 43.

The passing means 41 is composed of a receiving member 44 and a conveyor 45. The receiving member 44 receives a wafer separated from the wafer suction cup 32 in an accommodating section 44a which is formed so as to be slightly thicker than the wafer in the middle portion with respect to the thickness direction. The receiving member 44 receives, as shown in FIG. 11, the wafer in an upright position. After the suction by the wafer suction cup 32 has been canceled released, it is rotated around an axial body provided in the bottom edge portion and brought to the horizontal position as indicated by the two-dot chain line.

Where it is brought to the horizontal position, a conveyor 45 is provided which is driven such that conveyance in the direction of the arrow D is possible by two belts 45a. In addition, the receiving member has cutouts 44b (FIGS. 9 and 11) extending over the entire longitudinal dimension so as to be in alignment with the two belts 45a of the conveyor 45. From these cutouts 44b, the wafer is exposed downward, so that the wafer can be brought into contact with each belt 45a of the conveyor 45.

Thus, the wafer separated by the wafer suction cup 32 is temporarily accommodated in the receiving member 44, and, when the receiving member is brought to the horizontal position, it comes into contact with each belt 45a of the conveyor 45 through the cutouts 44b, and is detached from the receiving member 44 by friction force derived from each belt 45a before it is passed to the wafer cleaning means 42 by the conveyor 45 for the next step.

The wafer cleaning means 42 includes brush rollers 42a (brushes) for cleaning, spray nozzles (spray means) 42b for spraying a cleaning water (cleaning liquid) toward the portion to be cleaned by the brush rollers 42a, water absorbing rollers 42c for water conveyance wafers and water absorption, and a driving motor 42d for the brush rollers 42a and water absorbing rollers 42c.

Figure 13:
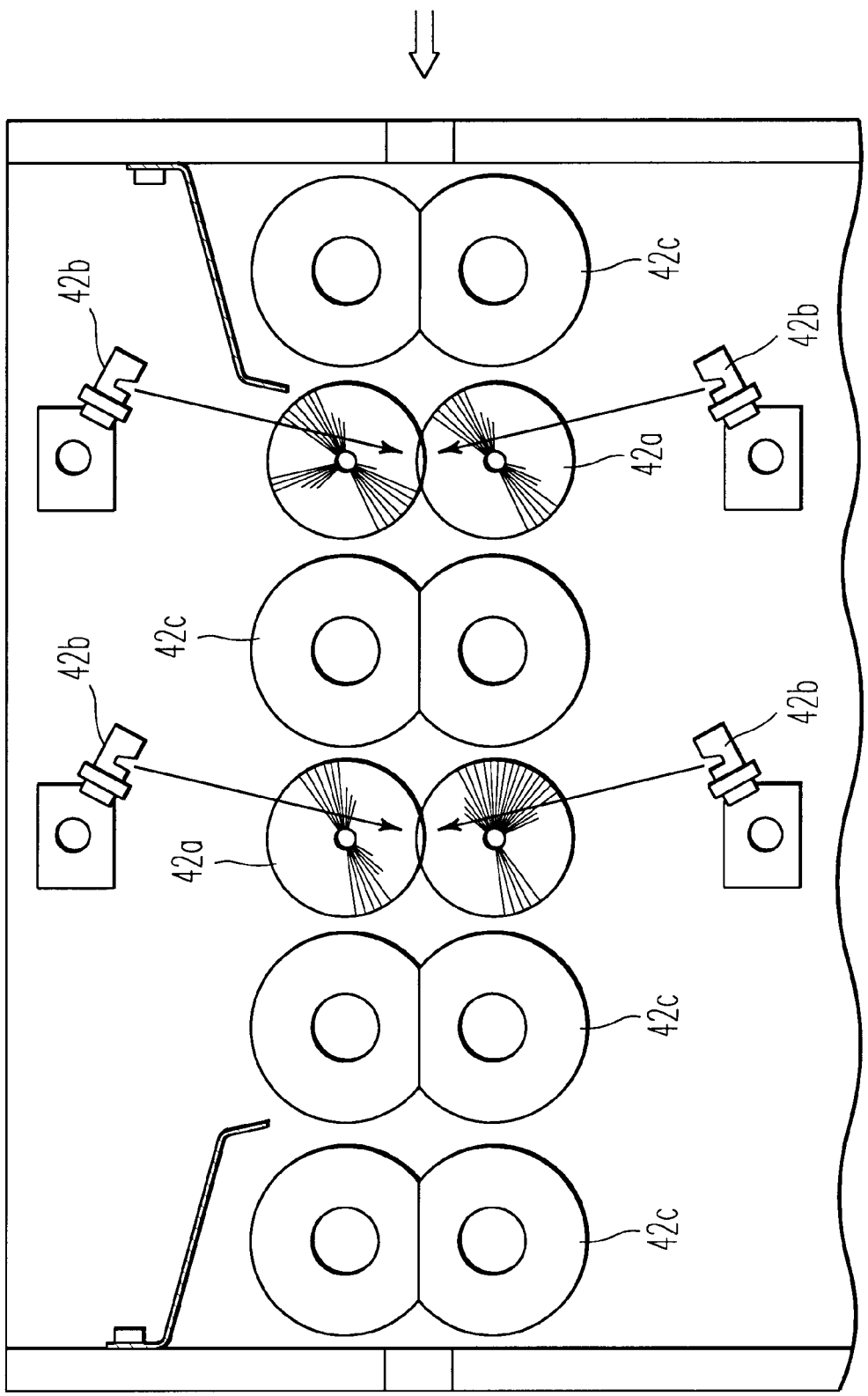
FIG. 13 is a front view showing in detail the wafer cleaning mechanism shown in FIG. 12.

In this case, the spray nozzles 42 are provided on both the upper and lower sides of the brush rollers 42a, as shown in FIG. 13, so that both sides of the wafer can be effectively cleaned.

The drying means 43 includes stainless-steel rollers 43b to which a plurality of O-rings are attached, a driving motor 43c for the rollers 43b and a hot air blowing means (not shown).

[Accommodating mechanism 50]

The accommodating mechanism 50 is, as shown in FIG. 1, disposed on the output side of the wafer cleaning mechanism 40 in order to accommodate the wafers which have undergone wafer cleaning and drying in a cassette (accommodating container) 51, and comprises a robot (wafer conveying means) 52.

A separating and cleaning method employing the apparatus for separating and cleaning wafers of the present invention constructed as described above will now be described.

[Cleaning process]

The workpiece W shown in FIG. 3 is sliced by the wire saw, and then passed to the row-of-wafers conveyor means 13 of the cleaning mechanism 10 by an appropriate conveying means. In this cleaning process, the row of wafers of the workpiece W is cleaned in this form. For this reason, a removal of cleaning liquid at an early stage is accomplished.

First, in the first wafer cleaning vessel 11A, cleaning is performed while applying ultrasonic vibrations by the ultrasonic vibrator 12, employing Clean Through KS1000 (trade name, manufactured by Kao Corporation) as a cleaning liquid. The ultrasonic vibration is effected in 28 kHz band, in which cavitation occurs to produce a great cleaning effect, and/or in 200 kHz band, in which the cleaning liquid can easily get into every narrow gap. In addition, during the cleaning, a shaking is applied to the workpiece W by the shaking means 14 to enhance the cleaning effect. Further, from time to time, the workpiece W is temporarily raised out of the cleaning liquid to allow the cleaning liquid to flow, and then immersed in the cleaning liquid again, whereby the cleaning effect is further enhanced.

Next, in the second wafer cleaning vessel 11B, the cleaning is performed employing a 5% aqueous solution of Clean Through KS1000 (trade name, manufactured by Kao Corporation) as the cleaning liquid. The cleaning conditions, such as the application of ultrasonic vibrations, the application of shaking, and the temporary raising of the workpiece W, etc. are similar to those described above.

In the third wafer cleaning vessel 11C, the cleaning is performed by employing water. The cleaning conditions, such as the application of ultrasonic vibrations, the application of shaking, and the temporary raising of the workpiece W, etc. are similar to those described above.

In this cleaning process, the cleaning conditions such as the type of cleaning liquid, the application of ultrasonic vibrations, the application of shaking, and a temporary raising of the workpiece W should be suitably adopted in accordance with the workpiece W, and are not restricted to those described above.

[Reversing process]

Next, before passing the cleaned row of wafers to the separating process, i.e. before immersing the row of wafers in the softening vessel 31, the fixing member 1 and the row of wafers are reversed upside down by this reversing step such that the fixing member 1 is located on the lower side.

This reversing operation is performed by driving the driving motor 23 to cause the rack 21a and the pinion 22c to be engaged with each other and rotating the engagement arm 22b and the workpiece W by 180° around the axis of the row of wafers.

[Separating process]

1. Softening Step

In this process, as indicated by the arrow E of FIG. 7, the reversed row of wafers is lowered by ascent/descent means (not shown), and the adhesive portion between the wafers and the fixing member 1 is immersed in the softening vessel 31, which is maintained at about 90° C. by the heater 31a, and fixed by the fixing cylinder 31b and the fixing frame 31c. This softened the adhesive to facilitate the separation.

2. First Moving Step

Next, the presser member 35 which has been at the retracted position 35B is moved to the pressing position 35A. Then, a sheet of wafer located at the end of the row of wafers is sucked by the wafer suction cup 32.

Thereafter, the air slide table 34 is driven to cause the shaft of the suction-cup rotary actuator 33 to move transversely through the connecting member 34a, whereby the wafer is moved in a planar direction as indicated by the arrow F in FIGS. 7 and 9 together with the wafer suction cup 32, with the wafer being sucked by the wafer suction cup 32. In this case, the spouting of an air flow from the air nozzle 37 is effected in parallel.

By this, of the bonded portion of the wafer and the fixing member 1 extending from a bonding point 30a to a bonding point 30b (FIG. 9), the end point 30b is employed as the fulcrum when the wafer turns with respect to the fixing member 1, whereby the softened bonded portion is separated gradually and continuously, starting from the other end point 30a.

3. Second Moving Step

Next, while effecting the spouting of air flow from the air nozzle 37 in parallel, the wafer is passed through the slit 35a of the presser member 35 together with the wafer suction cup 32, with the wafer being sucked by the wafer suction cup 32, as indicated by the arrow G in FIGS. 7 and 9, and extensively turned by the suction-cup rotary actuator 33. In this case, the presser member 35 continues to cover the end portion of the row of the wafers, and movement of the wafer suction cup 32 is permitted by the cutout 35b of the presser member 35.

By this, only the single wafer is separated from the fixing member 1.

[Wafer cleaning process]

Then, the wafer separated by the wafer suction cup 32 is temporarily accommodated in the receiving member 44. Further, by bringing down the receiving member 44, the wafer is brought into contact with each belt 45a of the conveyor 45 through the cutouts 44b, and, due to the frictional force derived from each belt 45a, detached from the receiving member 44 and passed to the wafer cleaning means 42 for the next step by the conveyor 45.

After the passing has been completed, the slide motor 38 is driven to collectively move the wafer suction cup 32, the swinging arm 32a, the suction-cup rotary actuator 33, the air slide table 34, the presser member 35, the presser-member rotary actuator 36, the air nozzle 37 and receiving member 44 by a predetermined length in the direction indicated by the arrow D in FIG. 11.

Next, while pouring water from above and below through the spray nozzle 42b by the wafer cleaning means 42, the cleaning with the brush rollers 42a, the conveyance of the water and water absorption by the water absorbing rollers 42c are performed. Further, the drying of the wafer is performed by the drying means 43.

[Accommodating process]

Finally, by the robot 52, each wafer which has undergone wafer cleaning and drying is accommodated in the cassette 51.

In this embodiment, the adhesive is dried in the softening step, and then the wafer is rotated using one end point of the glued portion as the fulcrum in the first moving step, so that the adhesive can be separated gradually and continuously, starting from the other end point of the glued portion, whereby the major portion of the adhesive can be separated with a small force. Thus, the separation can be effected without causing any strain on the wafers, thereby preventing cracking, chipping, etc. of the wafers.

Further, in the second moving step, the wafer is further moved in a planar direction so as to be brought out of the region of the row of wafers. Here, the major portion of the adhesive has already been removed, so that the separation can be achieved with a small force.

Further, by jetting an air flow toward the gap between the wafers, the surface tension between the wafers can be reduced, thereby making it possible to further reduce the requisite force for the separation.

Further, when the wafer is moved out of the region of the row of wafers, the presser member 35 is arranged at the pressing position 35A in the vicinity of an end of the row of wafers, so that, due to the slit 35a of the presser member 35, the passing through of the only one wafer situated at the end is permitted, whereby it is possible to prevent two adjacent wafers from moving together.

In the present embodiment, the cleaning is performed in the form of a row of wafers bonded on a fixing member, so that the grinding liquid is removed at an early stage, whereby the handling by an automatic means can be easily performed.

Also, the wafers are separated from the end of the row of wafers cleaned in the form of the row of wafers, whereby automation can be easily accomplished.

In addition, each wafer separated one at a time is sequentially cleaned, whereby contaminants remaining on the wafers can be removed.

Further, each wafer which has undergone wafer cleaning and drying is accommodated in the cassette 51 accommodating container, so that they are easily handled thereafter, whereby transition to the next step can be smoothly accomplished.

Still further, the cleaning step includes a plurality of cleaning processes, whereby the wafers can be cleaned more perfectly.

Incidentally, the present invention is not restricted to the above-described embodiment, and the following modifications are also possible.

a) Instead of silicon wafers, wafers of arbitrary semiconductor materials, magnetic materials and ceramics, etc. may be the object.

b) Instead of wafers of 8 inches in diameter, wafers of different sizes may be the object.

c) In the separating process, instead of, or in addition to the shifting of the wafer at the end of the row of wafers in a planar direction utilizing the air slide table 34, the shifting of the wafer at the end of the row of wafers may be effected by utilizing the cylinder 34b and hook 34c.

d) Instead of the separating mechanism 30 composed of the air slide table 34, wafer suction cup 32, etc., other arbitrary separating mechanisms may be employed.

e) In the separating process, instead of separating the wafers one at a time starting from one longitudinal end of the row of wafers, the wafers may be separated one at a time starting from both longitudinal ends of the row of wafers.

The method of and apparatus for cleaning wafers according to the present invention therefore offer the following advantages.

In the method of separating wafers of the present invention, the adhesive is softened in the softening step, and then the wafer is turned and moved using one end point of the glued portion as the fulcrum in the first moving step, so that the adhesive can be gradually and continuously separated starting from the other end point of the glued portion, whereby the major portion of the adhesive can be separated with a small force. Further, in the second moving step, the wafer is further moved in a planar direction to bring it out of the region of the row of wafers. At this stage, most of the adhesive has already been removed, so that only a small force is required for achieving the separation.

Also, in the method of separating wafers of the present invention, a gas flow is jetted toward the gap between the wafers, whereby the surface tension between the wafers can be reduced, and the requisite force for the separation can be further reduced.

Furthermore, in the method of separating wafers of the present invention, the glued portion is immersed in the softening vessel, whereby the adhesive is softened. Then, by utilizing the first moving means, the wafer suction cup and the fixing member are caused to slide relative to each other, whereby the wafer is turned and moved in a planar direction using one end point of the glued portion of the wafer and the fixing member as the fulcrum, so that the adhesive can be separated gradually and continuously, starting from the other end point of the glued portion, thereby making it possible to separate the major portion of the adhesive with a small force.

Further, by utilizing the second moving means, the wafer is moved out of the region of the row of wafers. In this case, the major portion of the adhesive has already been removed, so that the separation can be achieved with a small force.

In the apparatus for separating wafers of the present invention, in the vicinity of the wafer to be separated, there is provided a nozzle for jetting a gas flow toward the gap between the wafer to be separated and a wafer adjacent thereto, so that the surface tension between the wafers can be reduced, whereby the requisite force for the separation can be further reduced.

Also, in the apparatus for separating wafers of the present invention, when the wafer is moved by the second moving means, the presser member is arranged at a pressing position that is in the vicinity of the end of the row of wafers, so that, due to the slit of the presser member, passing through of only one wafer is allowed to thereby prevent adjacent wafers from moving together.

In the apparatus for separating wafers of the present invention, there is provided a reversing mechanism, whereby smooth transition from the foregoing step can be achieved.

Also, according to the method of cleaning wafers of the present invention, the cleaning is performed in the form of a row of wafers bonded on a fixing member, so that the grinding liquid is removed at an early stage, and the handling by an automatic means can be easily effected.

In addition, since the wafers are separated one at a time from the end of the row of wafers cleaned in the form of the row of wafers, automation can be easily accomplished. According to the method of cleaning wafers of the present invention, each wafer which has been cleaned one at a time is sequentially cleaned, whereby contaminants remaining on the wafers can be removed.

Furthermore, each of the wafers is accommodated in the accommodating container, so that its handling is easy, and transition to the next step is smoothly accomplished.

Also, the cleaning procedure includes a plurality of cleaning processes, whereby the wafers can be cleaned more perfectly.

According to a further feature of the apparatus for cleaning wafers of the present invention, the row of wafers is conveyed in the wafer cleaning vessel by the row of wafer conveying means, and cleaned in the wafer cleaning vessel in the form of the row of wafers. That is, the grinding liquid can be removed at an early stage.

In addition, a wafer located at the end of the cleaned row of wafers can be easily separated one at a time from the row of wafers by the wafer suction cup and the driving means.

According to the apparatus for cleaning wafers of the present invention, each of the wafers can be cleaned by the brushes while spraying cleaning liquid by the spraying means, whereby contaminants remaining on the separated wafers can be removed.

Also, each of the wafers can be accommodated in the accommodating container by the wafer conveying means, so that the transition to the next step can be smoothly accomplished.

Additionally, the cleaning mechanism is provided with a plurality of wafer cleaning vessels, so that a plurality of cleaning processes can be provided, whereby the wafers can be cleaned more perfectly.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of separating wafers from a row of wafers glued to a fixing member by an adhesive, said method comprising:

a softening step for softening said adhesive;

a first moving step for turning and moving a wafer in a planar direction using an end point of a glued portion between the wafer and said fixing member as a fulcrum; and a second moving step for further moving the wafer in a planar direction to bring the wafer out of a region of said row of wafers.

2. A method of separating wafers from a row of wafers glued to a fixing member by an adhesive, said method comprising:

a softening step for softening said adhesive;

a first moving step for turning and moving a wafer in a planar direction using an end point of a glued portion between the wafer and said fixing member as a fulcrum;

a second moving step for further moving the wafer in a planar direction to bring the wafer out of the region of said row of wafers; and a jetting step for jetting a gas flow toward a gap between the wafers.

3. A method for separating wafers from a row of wafers glued to a fixing member by an adhesive, said method comprising:

a softening step for softening said adhesive;

a sucking step for sucking a surface of a wafer;

a first moving step for turning and moving the sucked wafer in a planar direction using an end point of a glued portion between the wafer and said fixing member as a fulcrum; and a second moving step for further moving the wafer in a planar direction to bring the wafer out of a region of said row of wafers.

* * * * *